US010468990B2

(12) United States Patent
Gherdovich et al.

(10) Patent No.: US 10,468,990 B2
(45) Date of Patent: Nov. 5, 2019

(54) CONTROLLER CIRCUIT AND CORRESPONDING CONVERTER DEVICE

(71) Applicant: STMicroelectronics S.r.l., Agrate Brianza (IT)

(72) Inventors: Gabriele Gherdovich, Cernusco sul Naviglio (IT); Alberto Bianco, Gressan (IT); Giuseppe Scappatura, Aosta (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/129,377

(22) Filed: Sep. 12, 2018

(65) Prior Publication Data
US 2019/0097540 A1 Mar. 28, 2019

(30) Foreign Application Priority Data
Sep. 26, 2017 (IT) .................. 102017000107734

(51) Int. Cl.
*H02M 3/335* (2006.01)
*H02M 1/08* (2006.01)
*H02M 1/36* (2007.01)

(52) U.S. Cl.
CPC ......... *H02M 3/33507* (2013.01); *H02M 1/08* (2013.01); *H02M 3/33592* (2013.01); *H02M 1/36* (2013.01)

(58) Field of Classification Search
CPC .......... H02M 3/33592; H02M 1/4225; H03M 2001/0012; Y02B 70/1475
USPC ........ 363/16–20, 21.01–21.18; 323/290–299
See application file for complete search history.

(56) References Cited

U.S. PATENT DOCUMENTS

| | | | | |
|---|---|---|---|---|
| 6,418,039 B2 * | 7/2002 | Lentini | ............ | H02M 3/33592 363/21.05 |
| 7,023,717 B2 * | 4/2006 | Nakagawa | ........ | H02M 3/33523 323/349 |
| 8,064,229 B2 * | 11/2011 | Stuler | ............... | H02M 3/33592 363/21.02 |
| 8,218,340 B2 * | 7/2012 | Sato | ........................ | H02M 1/08 323/303 |
| 8,581,566 B2 * | 11/2013 | Takahashi | ............... | H02M 1/36 323/283 |

(Continued)

OTHER PUBLICATIONS

Lee et al., "No-Load Power Reduction Technique for AC/DC Adapters," *IEEE Transactions on Power Electronics* 27(8):3685-3694, Aug. 2012.

*Primary Examiner* — Rajnikant B Patel
(74) *Attorney, Agent, or Firm* — Seed Intellectual Property Law Group LLP

(57) ABSTRACT

A controller circuit for an AC-DC converter includes a first controller circuit block configured to drive one or more switches at the primary side of a transformer in the AC-DC converter. A second controller circuit block is configured to sense, at a secondary side of the transformer in said AC-DC converter, a secondary side signal indicative of the output signal from said AC-DC converter. The second controller circuit block generates switching control signals for the first controller circuit block as a function of the secondary side signal. An isolator circuit block between the first controller circuit block and the second controller circuit block includes an isolated transmission channel of the switching control signals from the second controller circuit block to the first controller circuit block.

19 Claims, 2 Drawing Sheets

(56) References Cited

U.S. PATENT DOCUMENTS

| | | | |
|---|---|---|---|
| 9,627,987 B2* | 4/2017 | Chen | H02M 3/33592 |
| 9,979,306 B1* | 5/2018 | Xu | H02M 1/143 |
| 10,116,222 B2* | 10/2018 | Cohen | H02M 3/33592 |
| 2010/0046252 A1 | 2/2010 | Keller | |
| 2015/0280576 A1* | 10/2015 | Hinz | H02M 3/33507 |
| | | | 363/21.15 |
| 2016/0336862 A1 | 11/2016 | Daly et al. | |
| 2016/0359419 A1 | 12/2016 | Lin et al. | |

* cited by examiner

CONTROLLER CIRCUIT AND CORRESPONDING CONVERTER DEVICE

BACKGROUND

Technical Field

The present description relates generally to controller circuits and more specifically to controlling converter circuits for use, e.g., in a charger apparatus.

Description of the Related Art

Certain AC/DC converters include a barrier to isolate the low voltage side, with which a user may come into contact, from a primary side, to be connected to a utility supply (e.g., a mains distribution grid).

For instance, isolation may be achieved by using a switching converter adopting an isolated (e.g., flyback) topology, controlled by an integrated circuit (IC) which drives the power switch(es), typically MOSFET transistor(s), at the primary side based on information about the secondary side voltage received through a dedicated isolator circuit.

BRIEF SUMMARY

Despite the extensive activity in that area, further improved solutions are desirable.

One or more embodiments relate to a charger device.

One or more embodiments may provide a one-chip system in a package wherein control of both the primary side and the secondary side of a converter is managed by a single controller.

BRIEF DESCRIPTION OF THE SEVERAL VIEWS OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the described embodiments.

Figure 1:
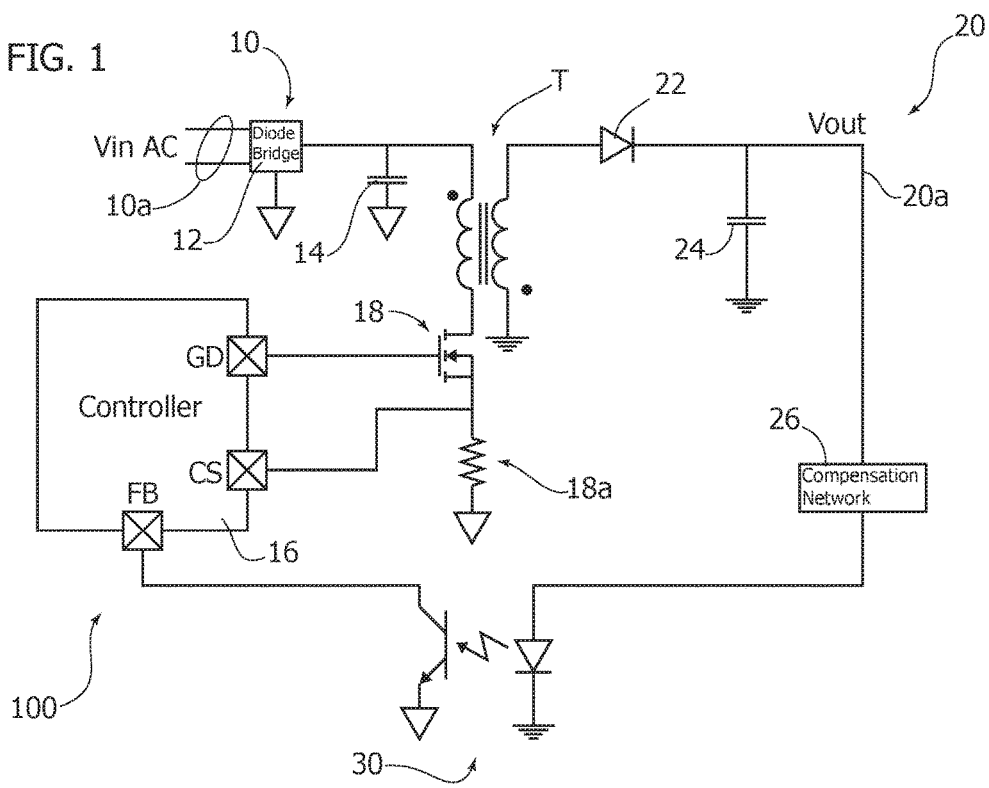
FIG. 1 is an exemplary diagram of an AC-DC converter device according to one embodiment of the present disclosure.

In FIG. 1, reference 100 indicates as a whole a AC/DC converter including a barrier (e.g., a transformer T) to provide electrical isolation between:

a primary side 10, having an input port 10a for connection to a utility supply, e.g., a mains supply grid at a (high) voltage Vin AC, e.g., 220 or 110 Volt AC, and a low-voltage secondary side 20, with which a user may come into contact, providing an low-voltage DC output over an output line 20a.

Coupling of the primary side of the transformer T to the input port 10a may be via a diode bridge 12 and a filtering capacitor 14, while the output line 20a may be coupled to the secondary side of the transformer T via a rectifier network including e.g., a diode 22 and a capacitor 24.

These features (and other possible features not visible in FIG. 1) are conventional in the art, thus making it unnecessary to provide a detailed description herein.

In an arrangement as exemplified in FIG. 1, isolation is achieved by resorting to an isolated flyback topology, controlled by a controller 16 (e.g., an integrated circuit—IC) at the primary side 10 which drives the primary side of the transformer T by means of one or more power switches 18. These switches may include MOSFET transistors, coupled to, e.g., a drive output GD of the controller 16.

To that effect the controller 16 may receive at a current sense input CS a signal indicative of the current through the switch(es) 18—and thus through the primary side of the transformer T—as sensed e.g., via an amperometric sensor (e.g., a resistor) 18a in the current path through the switch(es) 18.

In an arrangement as exemplified in FIG. 1 the controller 16 also receives at a feedback input FB a signal providing information about the voltage Vout at the secondary side 20.

This may occur via a dedicated isolator circuit (e.g., an opto-isolator) 30 conveying towards the controller 16 a feedback information signal provided by a compensation network 26 coupled to the output line 20a on the secondary side 20. For instance the compensation network 26 may include an error amplifier (e.g., a TL431 or similar component) plus passive components.

The controller 16 at the primary side 10 can thus receive at the feedback input FB a feedback signal from the secondary side 20 which may be indicative of e.g., an output voltage error or a power level required to regulate the output. The feedback information so received at the primary side 10 can be converted by the controller 16 into a reference signal (e.g., current) level to generate a (e.g., PWM-modulated) drive signal for the switch(es) 18 as a function of the feedback signal received.

An arrangement as exemplified in FIG. 1 may thus involve a controller 16, an optocoupler 30 and an error amplifier (e.g., an IC) in the compensation network 26.

Certain modern charger devices include a communication interface which permits interaction between a load and a charger e.g., in order to change certain conversion parameters such as the maximum current or the output voltage. This may occur through a USB power delivery (USB-PD) standard, which may involve a microcontroller at the secondary side to manage the interface and control the error amplifier accordingly, further increasing the total part count.

Also, certain modern converters may include synchronous rectification, where the diode in the rectifier network at the secondary side (see e.g., 22 in FIG. 1) is replaced by a switch (e.g., a MOSFET transistor). Such an arrangement may increase efficiency appreciably and involve an "extra" integrated circuit (IC) to control switching of the synchronous rectifier MOSFET. Having no direct information from the primary side controller, such an IC may have to estimate the primary side turn-on instants based on signals available at the secondary side.

One or more embodiments address the various issues discussed above by:

moving control management to the secondary side of the converter, where output voltage and current are readily available, would improve control performance;
 using a same microcontroller for controlling the converter loop and the communication interface would result in a more efficient use of such a microcontroller, with the extra advantage of improved flexibility in the control modes in comparison e.g., with standard analog primary side control;
 the integrated circuit which controls synchronous rectification at the secondary side having no direct information from the primary side controller is not an easy issue to address. This may involve e.g., long dead times where the associated MOSFET transistor is kept in an off state, with conduction maintained on a diode in order to avoid simultaneous turn-on states of the MOSFET transistors at the primary side and at the secondary side;
 a control system managed (wholly) from the secondary side would be a desirable option insofar as a single controller can manage control of the MOSFET transistor on both the primary side and the secondary side, with reduced dead times.

One or more embodiments may provide a one-chip system in a package wherein a (single) controller may direct operation of both the primary side and the secondary side of the converter.

Figure 2:
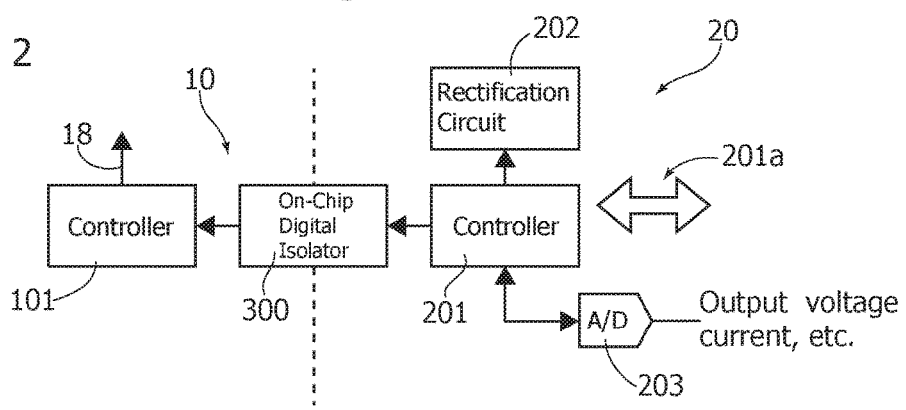
FIG. 2 is a block diagram exemplary of a possible general layout of a controller circuit according to embodiments of the present disclosure.

This may occur e.g., according to the layout exemplified in FIG. 2, where the same references of FIG. 1 were maintained to designate the primary side 10 and the secondary side 20 of a converter in order to facilitate possible reference and comparison with the layout of FIG. 1.

One or more embodiments as exemplified in FIG. 2, may include:

a controller 101 at the primary side 10 configured of controlling one or more switches (e.g., MOSFET transistors, such as 18 in FIG. 1) by acting e.g., on the gate(s) thereof, and
 a controller 201 at the secondary side 20 configured for acting, so-to-say, as a "master" controller of the system.

One or more embodiments as exemplified in FIG. 2 may include a (e.g., capacitive or inductive) on-chip digital isolator 300 between the primary side 10 and the secondary side 20.

In one or more embodiments as exemplified in FIG. 2 the on-chip isolator 300 is configured for sending to the controller 101 at the primary side 10 switching control signals from the controller 201 (e.g., a microcontroller) at the secondary side 20, so that operation of the primary side controller 101 will be directed by the controller 201 at the secondary side 20.

Figure 3:
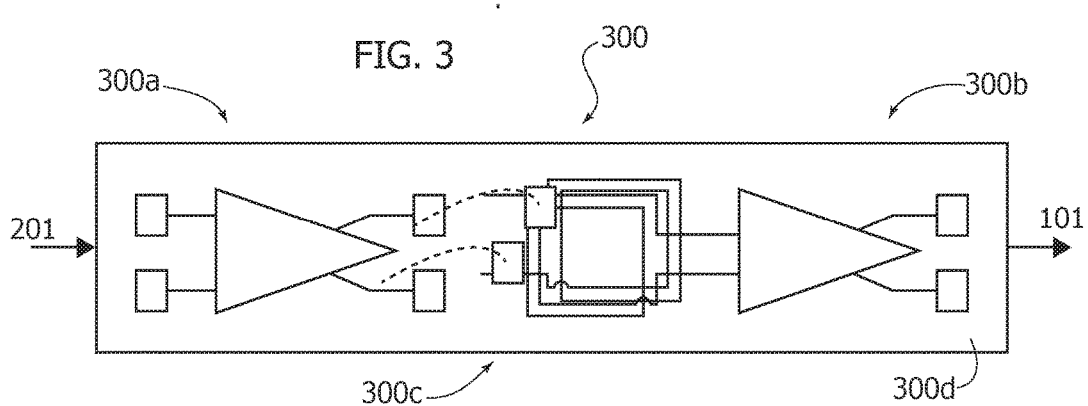
FIG. 3 is exemplary of an isolator circuit for use in embodiments of the present disclosure.

FIG. 3 shows an example of an on-chip digital isolator 300, including (according to an arrangement which is known to those skilled in the art) transmitter and receiver circuits 300a, 300b, to be coupled with the controller 201 and the controller 101, respectively, with a transformer 300c (e.g., a so-called U-transformer) therebetween.

Such a digital isolator 300 can be based on a thick oxide layer 300d which makes it suitable for integration on a chip together with the controllers at the primary side 10 or the secondary side 20.

In one or more embodiments, the isolator 300 may be of a digital type, configured for sending, e.g., a PWM signal and/or peak current level from the secondary side 20 to the primary side 10, so that safety isolation is facilitated.

In one or more embodiments, the isolator 300 may facilitate communication between the two controllers 101, 201 implemented as galvanically isolated semiconductor (e.g., silicon) dice.

While communication from the controller 201 (secondary side) to the controller 101 (primary side) is exemplified here, communication is feasible also in the opposite direction (e.g., to transfer information from the primary side 10 to the secondary side 20).

Figure 4:
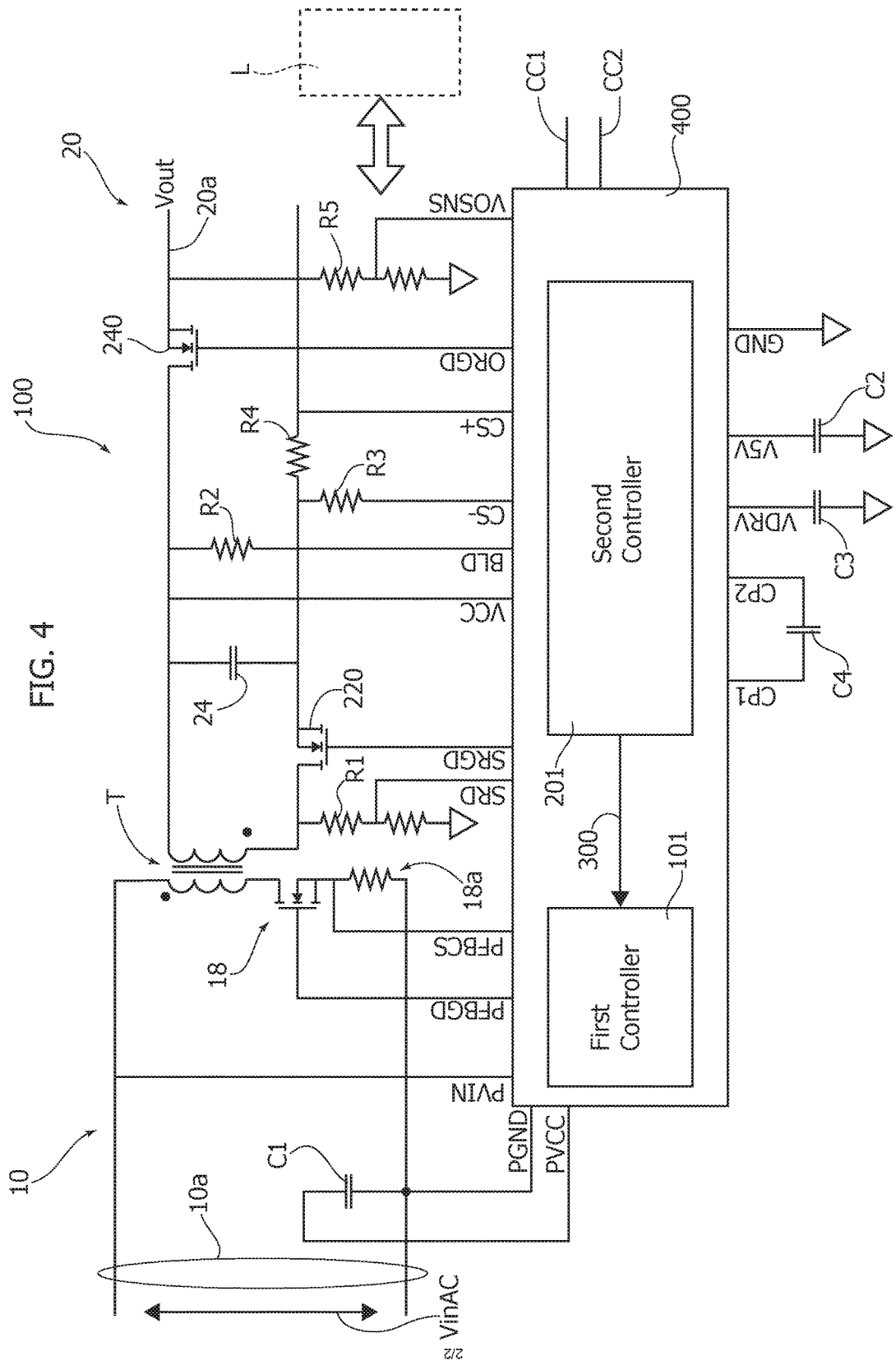
FIG. 4 is a detailed circuit diagram exemplary of a converter device including embodiments of the present disclosure.

FIG. 4 is exemplary of embodiments wherein a controller architecture as exemplified in FIG. 2 is applied to a converter 100 substantially corresponding to the basic layout of FIG. 1, wherein synchronous rectification (e.g., a switch such as a MOSFET transistor 220) replaces the diode 22 at the secondary side 20.

It is otherwise noted that synchronous rectification is an optional, non-mandatory feature, insofar as one or more embodiments may retain a diode-based "passive" rectifier network as exemplified in FIG. 1.

In FIG. 4, parts or elements like parts or elements already discussed in connection with FIG. 1 are indicated with like references and a corresponding detailed description will not be repeated for the sake of brevity.

In FIG. 4, reference 100 again indicates as a whole an AC/DC converter including an isolation barrier (e.g., a transformer T) to provide electrical isolation between a high-voltage primary side 10 having an input port 10a for e.g., connection to a utility supply Vin AC, and a low-voltage secondary side 20, adapted for providing a low-voltage DC output to a load L (e.g., a battery being charged) over an output line 20a.

The load L is shown in dashed line, insofar as in one or more embodiments the load L may be a distinct element from the embodiments, intended to be coupled to the converter device 100 only when supplied (e.g., while being charged).

The diagram of FIG. 4 is exemplary of the possibility for the controller 101 (primary side) and the controller 201 (secondary side) to be hosted on a single chip 400.

Communication from the controller 201 on the secondary 20 to the controller 101 at the primary side 10 may be via an isolator 300 as shown in FIG. 3. The isolator 300 is not illustrated as a distinct block in FIG. 4 in order to highlight the possibility for the isolator 300 to be integrated with the controller 101 or the controller 201 e.g., in a single chip 400 in one or more embodiments.

In one or more embodiments as exemplified in FIG. 4, the controller 101 at the primary side 10 drives the primary side of the transformer T by means of one or more power switches 18. One such switch is exemplified in FIG. 4 by a MOSFET transistor whose gate is coupled with a pin PFBGD of the chip 400. A signal indicative of the current through the switch or switches 18—and thus through the primary side of the transformer T—may be sensed by the controller 101 e.g., via an amperometric sensor (e.g., a resistor) 18a at a pin PFBCS of the chip 400.

Operation of the controller 101 at the primary side 10 as discussed previously may be directed by the controller 201 by providing to the controller 101 feedback in the form of switching control signals generated in the controller 201 e.g., as a function of an output voltage error or a power level required to regulate the output Vout.

These signals may be generated in the controller 201 and likewise used by the controller 101 in driving the switch(es) 18 in a manner known to those skilled in the art (e.g., as implemented in a conventional converter arrangement as exemplified in FIG. 1).

It will thus be appreciated that in one or more embodiments as exemplified herein emphasis is primarily placed on the fact that such signals may be generated in the controller 201 at the secondary side 20 and transmitted to the controller 101 at the primary side 10 via the isolator 300 rather than on the specific criteria adopted in the controllers 201 and 101 for generating such signals and driving (e.g., by means of PWM-modulated drive signals) the switch(es) 18 as a function of such signals.

In one or more embodiments the controller 201 may also be configured to control (in a manner known to those skilled in the art) a synchronous rectification switch 202.

As exemplified in FIG. 2, in one or more embodiments the controller 201 may support a communication interface 201a (e.g., using USB-PD, QuickCharge or similar protocols) with the capability of exchanging information e.g., on output voltage, current etc . . . , with other components, not visible in the figures. An analog-to-digital converter 203 is shown in FIG. 2 as exemplary of the capability of supporting such an exchange of information.

One or more embodiments as exemplified in FIG. 2 may thus include (at least) two ICs in a package, one at the primary side 10 (the controller 101) and one at the secondary side 20 (the controller 201).

In one or more embodiments, the IC controller 201 at the secondary side may be optionally implemented as a microcontroller with dedicated peripherals and be in charge of functions such as:

sending and receiving commands through the interface (e.g., USB-PD) 201a and managing the protocol communication stack, which includes sending information about the converter capabilities and changing power conversion parameters such as output voltage and current;

reading the output voltage and current, comparing them with a set point and/or one or more protection levels, and calculating the timings for the switches to maintain regulated output voltage and current values as desired.

This will apply to the turn-on and -off instants of the switch(es) at the primary side 10 as well as to the synchronous rectification circuit 202 at the secondary side 20.

An arrangement as exemplified herein (e.g., the controller 201) may be configured in such a way as to change the operating mode of the converter 100 e.g., as a function of the system output power in order to improve efficiency.

Two possible examples are as follows:

in the presence of a light load, the converter system can enter a "burst" operating mode, with conversion activated for a short time only once in a while.

in the presence of a medium load, the switching cycles of the converter can be "spread apart" by adding an extra dead time to reduce the switching frequency when the current is low.

In one or more embodiments, the primary side controller 101 can be configured for controlling one or more switches (e.g., MOSFETs) at the primary side 10 either directly (as shown in FIGS. 1 and 4) or indirectly (e.g., by sending switching control commands to an external driver circuit). Both types of direct/indirect switch control may be based on command signals received via the isolator 300 from the (main) controller 201 at the secondary side 20.

In one or more embodiments, generation of the switching control signals for the first controller 101 by the second controller 201 (e.g., as a function of the output signal Vout sensed) may involve any of:

the switching control signals being generated as direct timings to be sent to the controller 101;

the controller 201 setting the -on times indirectly, for example by calculating a current threshold for turning off the switch(es), e.g., a MOSFET transistor, at the primary side 10; other timing options can be event-based, e.g., a drain voltage in a MOSFET transistor in the synchronous rectifier circuit 202 reaching a threshold;

the turn-off instants for the MOSFET(s) or driver circuit (e.g., 18) at the primary side 10 being determined autonomously by the controller 101 by comparing the current of those MOSFET(s) or driver circuit (e.g., 18) with threshold values received from the secondary side 20 (controller 201) via the isolator 300.

In one or more embodiments, the controller 101 may be configured to be able (e.g., at startup) to autonomously control the primary side switch(es) until a signal is received from the secondary side. In one or more embodiments, the primary side controller 101 may thus be configured for performing an autonomous soft-start procedure, with the capability of controlling the MOSFET(s) or driver circuit at the primary side 10 even without receiving control signals from the secondary side 20. This function may take into account the fact that, when the converter system is first powered at first, the secondary side (which receives power through the same output it is intended to regulate) may not be sufficiently powered.

A circuit as shown in FIG. 4 may include e.g., two USB type-c pins CC1, CC2 in the chip 400 to communicate with the load L as well as the synchronous rectification switch 220 (e.g., a MOSFET transistor whose gate is driven by a pin SRGD in the chip 400) coupled between the secondary side of the transformer T and the capacitor 24.

A circuit as shown in FIG. 4 may also include a load switch 240 (e.g., a MOSFET transistor driven by a pin ORGD in the chip 400) which may be optionally provided in certain systems in order to selectively decouple (detach) the converter output line 20a (and the load L).

A chip as exemplified herein may also include various other pins as conventional in the art. FIG. 4 shows, merely by way of example and without any limiting intent (for instance, certain pins may be omitted and/or other pins may be present in addition or as an alternative to those exemplified herein), the following pins (clockwise, pins already discussed are not listed):

PVIN: input signal (Vin AC) sensing;

PVCC-PGND: supply voltage and primary side voltage reference with a first capacitor C1 therebetween;

SRD: sensing, via a resistive voltage divider R1, the voltage at a node between the secondary side of the transformer T and the synchronous rectification switch 220;

VCC: sensing the (rectified) voltage at the capacitor 24;

BLD: pin used as C24 capacitor discharge (bleeding), via a resistor R2 coupled between the capacitor 24 and the output line 20a (load switch 240);

CS+ and CS−: current sensing via resistors R3, R4;

VOSNS: sensing the output voltage Vout on the output line 20a (and the load L) via a resistive voltage divider R5;

GND: secondary side ground reference;

V5V and VDRV: reference voltage (e.g., 5V) and driver supply, coupled to ground via respective capacitors C2 and C3;

CP1, CP2: charge pump pins with a capacitor C4 therebetween.

A circuit according to one or more embodiments may include:

a first controller circuit block (e.g., 101) configured (e.g., PFBGD, PFBCS) for driving (directly or indirectly, e.g., via a driver circuit) at least one switch (e.g., 18) at a primary side (e.g., 10) of a transformer (T) in an AC-DC converter (e.g., 100), a second controller circuit block (e.g., 201) configured (e.g., R5, VOSNS) for sensing, at a secondary side (e.g., 20) of the transformer in said AC-DC converter, a secondary side signal (e.g., Vout directly, an output voltage error or a power level required to regulate the output) indicative of the output signal from said AC-DC converter and generating switching control signals for the first controller circuit block as a function of the secondary side signal sensed (VOSNS), and an isolator circuit block (e.g., 300) between the first controller circuit block and the second controller circuit block, the isolator circuit block including an isolated transmission channel (e.g., 300a, 300b, 300c) configured for transmitting the switching control signals from the second controller circuit block to the first controller circuit block.

In one or more embodiments, the isolator circuit block may be integrated with the first controller circuit block and/or the second controller circuit block.

In one or more embodiments, the first controller circuit block, the second controller circuit block and the isolator circuit block may be integrated in a single (semiconductor) chip.

In one or more embodiments, the isolator may include a digital isolator.

In one or more embodiments, the second controller circuit block may be configured (e.g., SRD, SRGD) for driving a synchronous rectification switch (e.g., 220) at the secondary side of the transformer in said AC-DC converter.

In one or more embodiments, the second controller circuit block may be is configured for exchanging load signals with a load supplied with the output signal at the secondary side of the transformer in said AC-DC converter, optionally for receiving commands for negotiating or setting load voltages and/or currents (see e.g., 203 in FIG. 2).

In one or more embodiments, the second controller circuit block may be configured for driving (e.g., ORGD) a decoupling switch (e.g., 240) for decoupling the output (e.g., Vout, 20a) at the secondary side of the transformer in said AC-DC converter.

In one or more embodiments, the second controller circuit block may be configured for generating switching control signals for the first controller circuit block by one of:

generating direct timings for the first controller circuit block; and/or calculating a current threshold for turning off the at least one switch at the primary side of the transformer in said AC-DC converter, and/or generating event-based switching control signals.

In one or more embodiments, the first controller circuit block may be configured for autonomously generating switching signals for the at least one switch at the primary side by comparing a drive current for the least one switch at the primary side with a threshold received from the second controller circuit block.

In one or more embodiments, the first controller circuit block may be configured for performing a start-up procedure by temporarily self-generating switching signals the at least one switch at the primary side absent switching control signals from the second controller circuit block.

In one or more embodiments, a device (e.g., an AC-DC converter device 100), may include:

an AC input port (e.g., 10a) and a DC output line (e.g., 20a), a transformer (e.g., T) having a primary side (e.g., 10) coupled to the AC input port via at least one switch (e.g., 18) at the primary side of the transformer and a secondary side (e.g., 20) coupled (e.g., 24, 220, 240) to the DC output line via a rectifier network (e.g., of the passive type 22, 24 or of the synchronous type 24, 220), and a circuit according to one or more embodiments with the first controller circuit block driving (directly or indirectly, via a driver) the at least one switch at the primary side of the transformer and the second controller circuit block coupled to the DC output line (e.g., 20a) and sensing the secondary side signal (Vout) indicative of the output signal from said AC-DC converter (100).

In one or more embodiments:

the rectifier network may include a synchronous rectification switch (e.g., 220) at the secondary side of the transformer, and the second controller circuit block may be configured (e.g., SRD, SRGD) for driving the synchronous rectification switch.

In one or more embodiments, the device may include a charger device for electrically charging a load (e.g., L).

Without prejudice to the underlying principles, the details and the embodiments may vary, even significantly, with respect to what has been described by way of example only without departing from the extent of protection.

The extent of protection is defined by the annexed claims.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, including:

a first controller circuit configured to drive a switch at a primary side of a transformer in an AC-DC converter;

a second controller circuit configured to sense, at a secondary side of the transformer in said AC-DC converter, a secondary side signal indicative of an output signal from said AC-DC converter and to generate switching control signals for the first controller circuit as a function of the secondary side signal; and an isolator circuit between the first controller circuit and the second controller circuit, the isolator circuit including an isolated transmission channel configured to transmit the switching control signals from the second controller circuit to the first controller circuit, wherein the second controller circuit block is configured to calculate a current threshold for turning off the switch and send the current threshold in the switching control signals to the first controller circuit via the isolator circuit.

2. The circuit of claim 1, wherein the isolator circuit is integrated with at least one of the first controller circuit or the second controller circuit.

3. The circuit of claim 2, wherein the first controller circuit, the second controller circuit, and the isolator circuit are integrated in a single chip.

4. The circuit of claim 1, wherein the isolator circuit includes a digital isolator.

5. The circuit of claim 1, wherein the second controller circuit is configured to drive a synchronous rectification switch at the secondary side of the transformer in said AC-DC converter.

6. The circuit of claim 1, wherein the second controller circuit is configured to exchange load signals with a load supplied with the output signal at the secondary side of the transformer in said AC-DC converter.

7. The circuit of claim 6, wherein the load signals include commands for setting at least one of load voltages or load currents of the load.

8. The circuit of claim 1, wherein the second controller circuit block is configured to drive a decoupling switch configured to decouple an output at the secondary side of the transformer in said AC-DC converter.

9. The circuit of claim 1, wherein the second controller circuit block is configured to generate switching control signals for the first controller circuit block by one of:
generating direct timings for the first controller circuit; and
generating event-based switching control signals.

10. The circuit of claim 1, wherein the first controller circuit is configured to autonomously generate switching signals for the switch at the primary side by comparing a drive current for the switch with the current threshold received from the second controller circuit block.

11. The circuit of claim 1, wherein the first controller circuit is configured to perform a start-up procedure by temporarily self-generating switching signals absent switching control signals from the second controller circuit.

12. A device, comprising:
an AC input port and a DC output line;
a transformer having a primary side coupled to the AC input port through a switch and a secondary side coupled to the DC output line through a rectifier network; and
a circuit including:
a first controller circuit configured to drive the switch;
a second controller circuit configured to sense a secondary side signal indicative of an output signal on the DC output line and configured to generate switching control signals as a function of the sensed secondary side signal; and
an isolator circuit coupled between the first controller circuit and the second controller circuit, the isolator circuit including an isolated transmission channel configured to transmit the switching control signals from the second controller circuit to the first controller circuit, wherein the second controller circuit block is configured to calculate a current threshold for turning off the switch and send the current threshold in the switching control signals to the first controller circuit via the isolator circuit.

13. The device of claim 12, wherein the rectifier network comprises:
a synchronous rectification switch coupled to the secondary side of the transformer; and
wherein the second controller circuit is configured to drive the synchronous rectification switch.

14. The device of claim 13, wherein the synchronous rectification switch comprises a MOSFET transistor.

15. The device of claim 12, further comprising a charger device for electrically charging a load.

16. A method, comprising:
sensing a secondary side signal on a secondary side of a transformer of an AC-DC converter;
generating on the secondary side of the transformer a plurality of switching control signals to be utilized to control a switch of the AC-DC converter on the primary side of the transformer, the plurality of switching control signals being based on the secondary side signal;
communicating the generated plurality of switching control signals on the secondary side of the transformer to the primary side of the transformer; and
controlling the switch on the primary side of the transformer based on the plurality of switching control signals communicated from the secondary side of the transformer, wherein generating on the secondary side of the transformer the plurality of switching control signals includes calculating a current threshold for turning off the switch and communicating the generated plurality of switching control signals includes communicating the current threshold in the switching control signals to the primary side.

17. The method of claim 16, wherein the plurality of switching control signals set on times of the at least one switch of the AC-DC converter on the primary side of the transformer.

18. The method of claim 16, further comprising controlling the switch of the AC-DC converter on the primary side of the transformer independent of the switching control signals during a startup phase of the AC-DC converter.

19. The method of claim 16, wherein communicating the generated plurality of switching control signals comprises communicating the generated plurality of switching control signals through a digital isolator from the secondary side of the transformer to the primary side of the transformer.

* * * * *